(12) United States Patent
Hsu (10) Patent No.: US 7,321,164 B2
(45) Date of Patent: Jan. 22, 2008

(54) STACK STRUCTURE WITH SEMICONDUCTOR CHIP EMBEDDED IN CARRIER

(75) Inventor: Shih-Ping Hsu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 205 days.

(21) Appl. No.: 11/294,842

(22) Filed: Dec. 5, 2005

(65) Prior Publication Data

US 2007/0035015 A1    Feb. 15, 2007

(30) Foreign Application Priority Data

Aug. 15, 2005    (TW) .............................. 94127691 A (51) Int. Cl.
*H01L 23/02*    (2006.01)
*H01L 23/34*    (2006.01)

(52) U.S. Cl. ..................... 257/686; 257/685; 257/723; 257/725; 257/773; 257/774; 257/776; 257/777; 257/E25.013; 257/E23.169; 361/735; 361/790

(58) Field of Classification Search ................ 257/685, 257/686, 723–725, 773–777, 747, 748, 750–760, 257/780–786, E27.01, E25.01–E25.013, 257/E23.169

See application file for complete search history.

(56) References Cited

U.S. PATENT DOCUMENTS 5,111,278 A * 5/1992 Eichelberger ............... 257/698

| 6,400,573 | B1 * | 6/2002 | Mowatt et al. ............. 361/719 |
| 6,798,049 | B1 | 9/2004 | Shin et al. |
| 7,091,593 | B2 * | 8/2006 | Ishimaru et al. ............ 257/686 |
| 7,135,780 | B2 * | 11/2006 | Jiang .......................... 257/783 |
| 7,196,408 | B2 * | 3/2007 | Yang et al. ................. 257/686 |
| 2004/0033654 | A1 * | 2/2004 | Yamagata ................... 438/202 |
| 2005/0093142 | A1 * | 5/2005 | Terui .......................... 257/723 |
| 2005/0275088 | A1 * | 12/2005 | Sakurai et al. ............. 257/723 |

* cited by examiner

*Primary Examiner*—Jasmine Clark
(74) *Attorney, Agent, or Firm*—Sawyer Law Group LLP (57) ABSTRACT

A stack structure with semiconductor chips embedded in carriers comprises two carriers stacking together as a whole, at least two semiconductor chips having active surfaces with electrode pads and inactive surfaces corresponding thereto placed in the cavities of the carriers, at least one dielectric layer formed on the active surface of the semiconductor chip and the surface of the carrier, at least a conductive structure formed in the opening of the dielectric layer, and at least a circuit layer formed on the surface of the dielectric layer wherein the circuit layer is electrically connected to the electrode pad by the conductive structure, so as to form a three-dimensional module to increase the storage capacity dramatically and integrate the semiconductor chips in the carriers for efficiently reducing the size of the module, so that the combinations can be changed flexibly to form the required storage capacity according to the demands.

13 Claims, 6 Drawing Sheets

STACK STRUCTURE WITH SEMICONDUCTOR CHIP EMBEDDED IN CARRIER

FIELD OF THE INVENTION

The present invention relates to stack structures of semiconductor chips embedded in carriers, and more particularly, to a stack structure having one or more semiconductor chips embedded in one or more carriers before stacking the carriers together.

BACKGROUND OF THE INVENTION

Due to the rapid development of electronic technology, electronic products with multi-functions and high performances have been developed so as to satisfy the demand of high integration and miniaturization of semiconductor packaging and to improve the storage capacity and performance of the semiconductor package, in order to accommodate tendency of the miniaturization, large storage capacity and high speed of electronic products. In prior art, most of the semiconductor packages are fabricated by the Multi Chip Module (MCM) technology. Such packing technology allowing the size of the package to be reduced and the electric performance to be improved has thereby become a mainstream packaging technology having at least two semiconductor chips placed on a chip carrier of single package in the MCM package, wherein each semiconductor chip is placed in the carrier by stacking. Such stack-type chip package structure is disclosed in U.S. Pat. No. 6,798,049.

Figure 1:
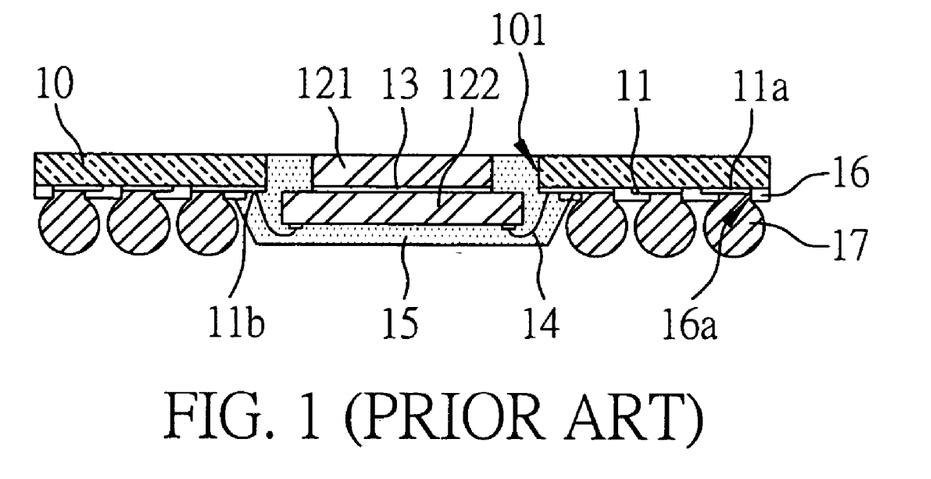
FIG. 1 (PRIOR ART) is a cross-sectional view showing the invention disclosed by U.S. Pat. No. 6,798,049.

As shown in FIG. 1, a cross-sectional view showing a Cavity-Down Ball Grid Array (CDBGA) package as disclosed in U.S. Pat. No. 6,798,049 is characterized in that forming a hole 101 in a circuit board 10 having a circuit layer 11; forming the circuit layer 11 having an electrically connecting pads 11a and bond pads 11b formed thereon on at least one side of the circuit board 10; combing two stacked semiconductor chips 121 and 122 in the hole 101, wherein the stacked semiconductor chips 121 and 122 are electrically connected by a bounding layer 13 formed therebetween and the semiconductor chip 122 is electrically connected to the bond pad 11b of the circuit layer 11 by a connection mean 14 such as a gold wire; filling an encapsulant 15 in the hole 101 of the circuit board 10 to encapsulate the semiconductor chips 121 and 122 and the connection mean 14; forming an insulating layer 16 on the circuit board; forming a plurality of openings 16a on the insulating layer 16 for exposing the electrically connecting pads 11a; forming an electric element 17 such as a solder ball on each opening 16a of the insulating layer 16 so as to complete the packaging process.

For such aforementioned package, the stacked semiconductor chips 121 and 122 are electrically connected to the circuit layer 11 by wire bonding. Since the height of the package is increased by the height of the arc line of the wire bond type structure, the purpose of being slim and small is thus unable to achieve. Moreover, the semiconductor chips 121 and 122 are electrically connected by the bonding layer 13 in chip-level, that is to say, the stacking process of the semiconductor chips 121 and 122 must be done in a semiconductor factory (wafer foundry) before having the packaging process being done in a semiconductor package factory, thus the process as such is more complicated and the cost of fabrication is increased.

If electrical performance and performance of modularization are improved by stacking process, it is required to proceed such stacking for further improvement. As a result, the thickness of the package will be increased as well as the complexness of the circuit layer 11 and the amount of the bonding pad 11b of the circuit layer 11. However, in order to increase density of the circuits and the amount of bonding pads 11b in a limiting or fixed area for packaging, the circuit of the circuit board used to carry the semiconductor chips 121, 122 must be fine enough to achieve the demand for the thin and small packaging. However, to reduce the area of circuit board by the fine circuit has a limited effect; and to improve the electric performance and the performance of modularization by directly stacking the semiconductor chips 121 and 122 is unfavorable as it may not be able to expand continuously due to the limited amount of the stacked chips, thus the purpose of being slim and small is also unfeasible.

In this regard, to increase the chip density placed on a multi-layer circuit board and decrease the area occupied by the semiconductor chips on the multi-layer circuit board for reducing the size of the package to improve the storage capacity have become an important issue in the circuit board industry.

SUMMARY OF THE INVENTION

In light of the above prior-art drawbacks, a primary objective of the present invention is to provide a stack structure with semiconductor chips embedded in a carrier to form a module structure.

Another objective of the present invention is to provide a stack structure with semiconductor chips embedded in a carrier to flexibly change the number of semiconductor chips based upon demands, so as to provide a greater flexibility on changing combinations.

Still another objective of the present invention is to provide a stack structure with semiconductor chips embedded in a carrier, so as to reduce the size of the module.

In accordance with the above-mentioned and other objectives, the present invention proposes a stack structure with semiconductor chips embedded in a carrier, mainly comprising: two carriers having at least one cavity formed thereon respectively and being stacked as a whole by a linking layer; at least two semiconductor chips placed in the cavity of the carriers respectively, wherein the semiconductor chips respectively comprise an active surface with a plurality of electrically connecting pads formed thereon and an inactive surface corresponding to the active surface; at least one dielectric layer formed on the active surface of the semiconductor chip and the surface of the carrier, wherein at least an opening is formed in the dielectric layer at a position corresponding to the top of the electrode pad; at least one circuit layer formed on the surface of the dielectric layer and at least a conductive structure formed in the opening of the dielectric layer, wherein the circuit layer is electrically connected to the electrode pad of the semiconductor chip by the conductive structure. The carriers are stacked with a linking layer formed therebetween so as to form a module structure allowing the combinations and the amounts of semiconductor chips to be changed flexibly, in order to meet the demands of different alternation with a greater flexibility on changing combinations.

The semiconductor chips are placed in the cavities of the carriers and then the carriers are stacked together having the active surface of the semiconductor chip and the surface of the carrier formed with a dielectric layer, a circuit layer and a conductive structure electrically connected to the electrode pad of the semiconductor chip, so as to form a stack module structure to avoid the thickness increment resulted from directly stacked up caused in prior art and the defects of wire bounding to reduce the size to achieve the purpose for being slim and small.

Moreover, at least one plated through hole (PTH) is penetrated throughout the dielectric layers, the circuit layers, the linking layer and at least two carriers, so as to electrically connect the semiconductor chips of at least two carriers via the circuit layer and the plated through hole.

A further implementation of the present invention, a circuit build-up structure is formed on the surface of the dielectric layer and the circuit layer, wherein a plurality of the conductive structures are formed in the circuit build-up structure to electrically connect the circuit layer and the connecting pads formed on the surface of the circuit build-up structure. Further, the surface of the circuit build-up structure is formed with a solder mask layer having a plurality of openings formed thereon to expose the connecting pad of the circuit build-up structure and conductive elements formed on the opening of the solder mask layer for electrically connecting to the connecting pads, so as to form circuit board structure of the carrier embedded with the semiconductor chips.

Furthermore, the circuit build-up structure comprises a dielectric layer, a circuit layer stacked thereon, and a plurality of conductive structures formed therein.

As the semiconductor chips embedded in the carrier has a dielectric layer, a circuit layer and conductive structures electrically connected to the electrode pads of the semiconductor chip so as to form a module structure with a circuit build-up structure formed thereon, so that the combinations can be changed flexibly to form the required storage capacity according to the requirement of use

DETAILED DESCRIPTION OF PREFERRED EMBODIMENTS

The following embodiments are used to describe the present invention, but they are not restrictive in all aspects.

First Preferred Embodiment

Figure 2A:
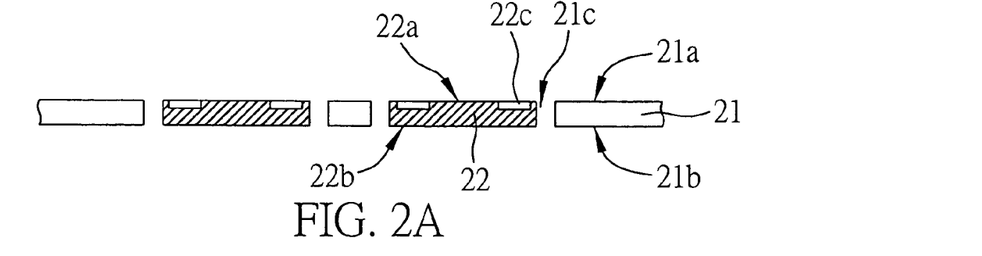
FIGS. 2A to 2D are cross-sectional views showing a stack structure with semiconductor chips embedded in a carrier according to a first embodiment of the present invention.
Figure 2B:
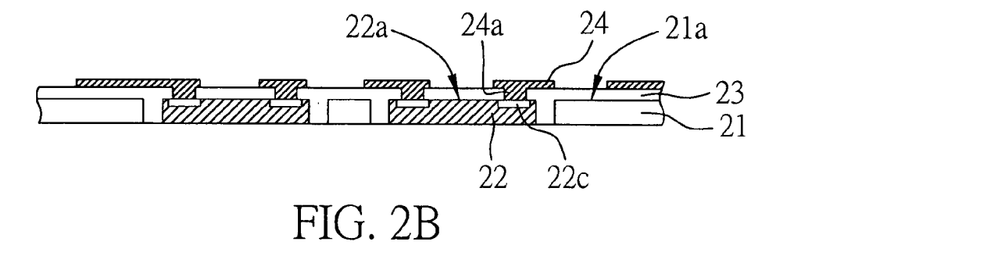
Figure 2C:
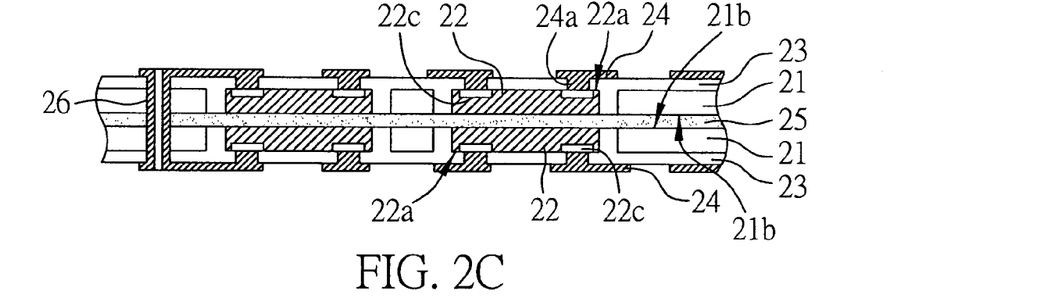

Referring to FIG. 2A to 2C, crossing-sectional views showing a stack structure with semiconductor chips embedded in a carrier according to the present invention are provided.

FIG. 2A shows at least two carriers 21, respectively, having a first surface 21a and a second surface 21b with at least a cavity 21c formed on the carrier 21 that is penetrated through the first and the second surfaces 21a and 21b, wherein the carrier 21 is an insulating board or a circuit board with circuits. The cavity 21c has at least a semiconductor chip 22 placed therein by an adhesive material (not shown) fastening the semiconductor chip 22 in the cavity 21c of the carrier 21. The semiconductor chip 22 is at least one of the group of active components and the group of passive components, wherein the active components may be a memory and the passive components may be an electronic component such as a resistor, a capacitor, an inductor. or the like. Further, the semiconductor chip 22 comprises an active surface 22a and an inactive surface 22b corresponding thereto, wherein the active surface 22a comprises a plurality of electrode pad 22c. The active surfaces 22a of the semiconductor chips 22 are secured in the same direction in the cavity 21c of the same carrier 21.

Referring to FIG. 2B, a dielectric layer 23 is formed on the active surface 22a of the semiconductor chip 22 and the first surface 21a of the carrier 21, wherein at least an opening 23a is formed in the dielectric layer 23 at a position corresponding to the top of the electrode pad 22c. At least one circuit layer 24 is formed on the surface of the dielectric layer 23 and at least a conductive structure 24a is formed in the opening 23a of the dielectric layer 23, wherein the circuit layer 24 is electrically connected to the electrode pad 22c of the semiconductor chip 22 by the conductive structure 24a.

Figure 2D:
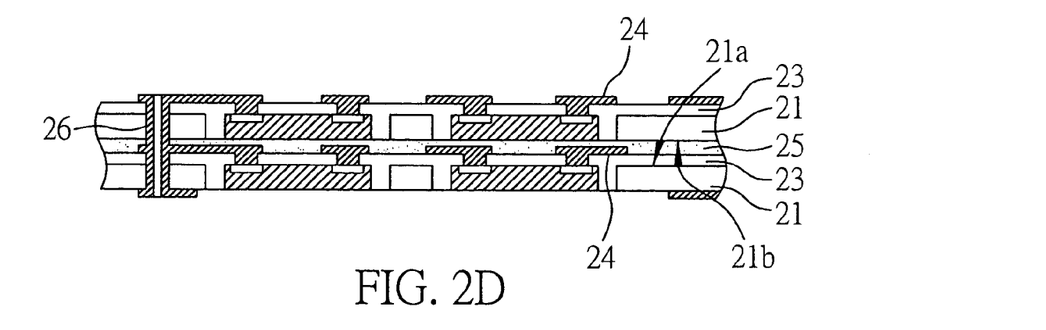

Referring to FIGS. 2C and 2D, two carriers 21 having the semiconductor chips embedded therein are stacked with an linking layer 25 formed therebetween, wherein the linking layer 25 may be an organic adhesive layer. The second surface 21a of the carrier 21 may be stacked with the second surface 21b of another carrier 21 as a whole in a vertically opposite position as shown in FIG. 2C. The first surface 21a of the carrier 21 may be stacked with the first surface 21a of another carrier 21 forming a stack structure that is also in a vertically opposite state (not shown). The carriers 21 may use the circuit layer 24 and the dielectric layer 23 formed on the first surface 21a to stack with the second surface 21b of another carrier 21 in a manner as stacking in the same direction, as shown in 2D, with at least a plated through hole 26 penetrating through the dielectric layer 23, the circuit layer 24, the linking layer 25 and two carriers 24, making the plated through hole 26 electrically connected to the circuit layer 24 to electrically connecting the semiconductor chips 22 therebetween embedded in the carrier 21, so as to form a module structure.

The semiconductor chips 22 are embedded in the cavity 21c of the carrier 21, wherein a plurality of semiconductor chips 22 may be embedded in the carrier 21 so as to increase the amount of the semiconductor chips 22 placed on the carrier 21 to increase its storage capacity. Moreover, a dielectric layer 23 and a circuit layer 24 with conductive structure 24a may be formed on the active surface 22a of the semiconductor chip 22 and the first surface 21a of the carrier 21, wherein the conductive structures 24a are electrically connected to the electrode pad 22c of the semiconductor chip 22. And then at least two carriers 21 are stacked together as a whole by the linking layer 25, and the electroplated through hole 26 are connected to such circuit layer 24 so as to electrically connect more semiconductor chips 22, in order to reduce the size of the whole structure and to avoid directly stacked up in prior art and the defects of wire bonding.

Moreover, embedding the semiconductor chips 22 into the carrier 21 and then stacking the carriers 21 can be done in different combinations and altered, according to different demands so as to provide a better flexibility in modifications.

Second Preferred Embodiment

Figure 3A:
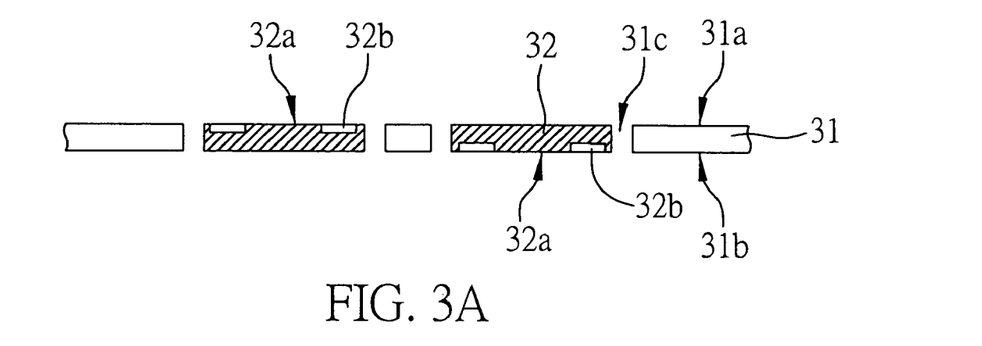
FIGS. 3A to 3B are cross-sectional views showing a stack structure with semiconductor chips embedded in a carrier according to a second embodiment of the present invention.
Figure 3B:
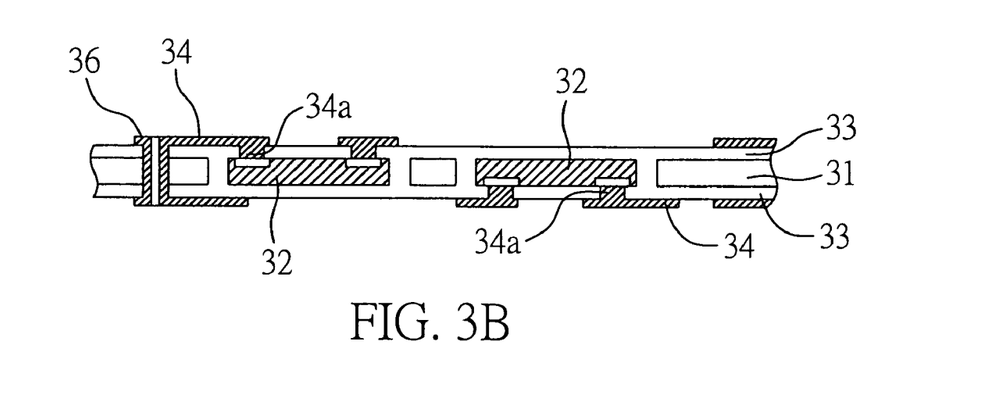

Referring to FIGS. 3A and 3B, cross-sectional views showing a stack structure with semiconductor chips embedded in a carrier according to another embodiment of the present invention are provided, wherein it is distinguished from the foregoing embodiment by having the active surfaces of the semiconductor chips embedded in the cavity of the carrier in different directions.

Referring to FIG. 3A, a plurality of cavities 31c of the carrier 31 have respectively semiconductor chips 32 placed therein. It may be achieved by employing an adhesive material (not shown) to secure the semiconductor chip 32 to the cavity 31c of the carrier 31, wherein the active surface 32a of the semiconductor chip 32 is selectively formed on the first surface 31a and the second surface 31b of the carrier 31, so that the first and the second surfaces 31a and 31b of the carrier 31 have the active surfaces 32a of the semiconductor chips 32 respectively.

Referring to FIG. 3B, the first and the second surfaces 31a and 31b of the carrier 31 respectively have the dielectric layers 33 and the circuit layers 34 with the conductive structures 34a formed thereon, wherein the conductive structures 34a are electrically connected to the electrode pads 32b of the semiconductor chips 32, so that the top surface and the bottom surface of the carrier 31 respectively comprise the circuit layer 34, so as to spread the circuits on both sides of the carrier 31.

The carrier 31 having circuits on both sides may be stacked according to the demand, and then connected the circuit layers 34 at different layers by the electroplated through hole 36 so as to increase the amount electrically connected by the semiconductor chips 32, improving the electrical performance and performance of modularization, reducing the overall size of the stack structure to achieve the purpose of being slim and small, and having greater flexibility in changing combinations to meet different demands.

Third Preferred Embodiment

Figure 4A:
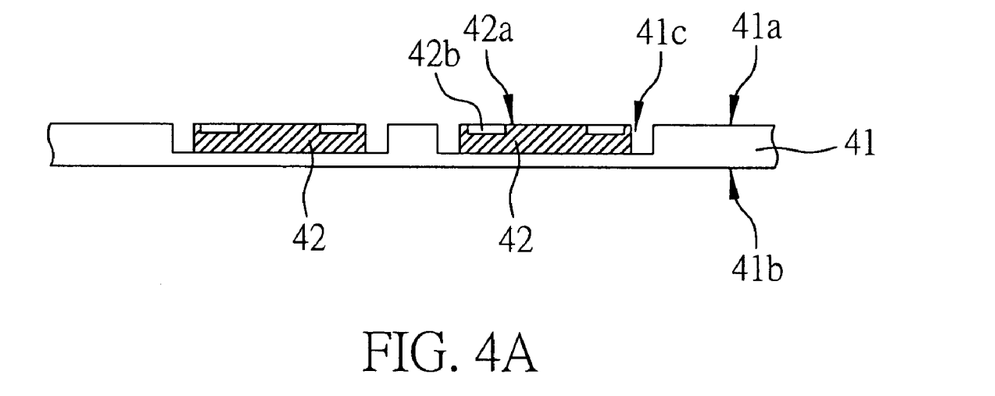
FIGS. 4A to 4B are cross-sectional views showing a stack structure with semiconductor chips embedded in a carrier according to a third embodiment of the present invention.
Figure 4B:
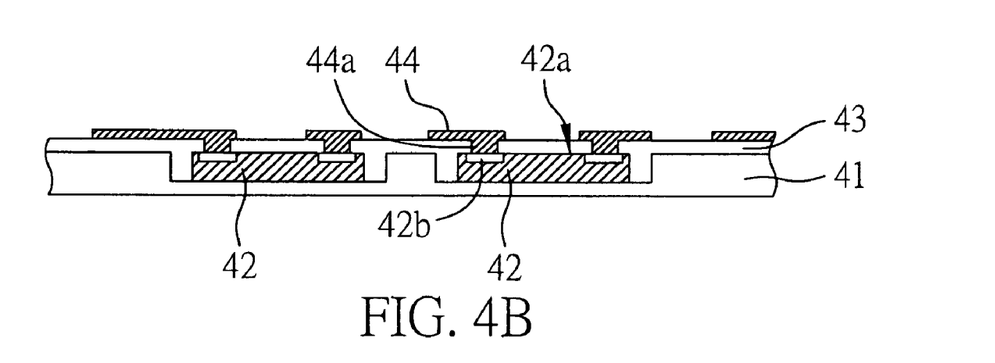

Referring to FIGS. 4A and 4B, cross-sectional views showing a stack structure with semiconductor chips embedded in a carrier according to another embodiment of the present invention are provided, wherein it is distinguished from the foregoing embodiment by having a cavity 41c of a carrier 41 that is non-through. The direction of the cavities 41c are selectively formed on the first surface 41a or the second surface 41b of the carrier 41. The semiconductor chips 42 may be placed in the cavity 41c with the active surfaces 42 of the semiconductor chips 42 facing the same direction or different direction. The dielectric layer 43 and the circuit layer 44 having the conductive structures 44a are formed on the active surface 42a of the semiconductor chip 42 and the surface of the carrier 41, wherein the conductive structures 44a are electrically connected to the electrode pads 42b of the semiconductor chip 42, thereby reducing the overall size of the stack structure achieving the foregoing purpose of being slim and small with greater flexibility in changing combinations, in order to meet different demands.

Fourth Preferred Embodiment

Figure 5A:
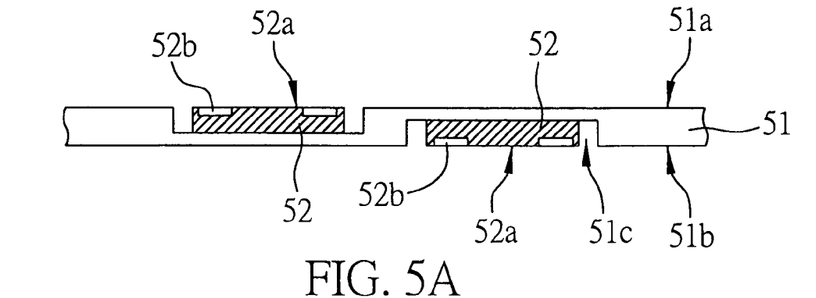
FIGS. 5A to 5D are cross-sectional views showing a stack structure with semiconductor chips embedded in a carrier according to a fourth embodiment of the present invention.
Figure 5B:
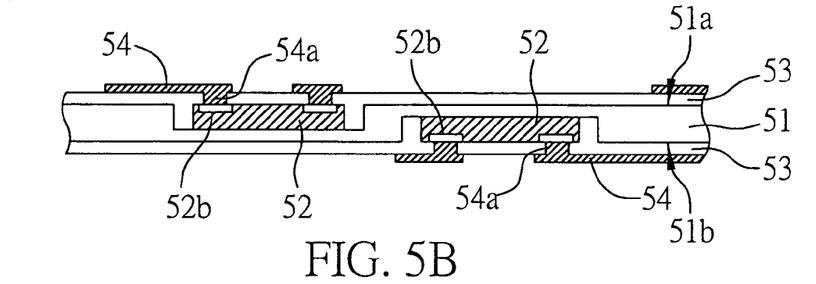
Figure 5C:
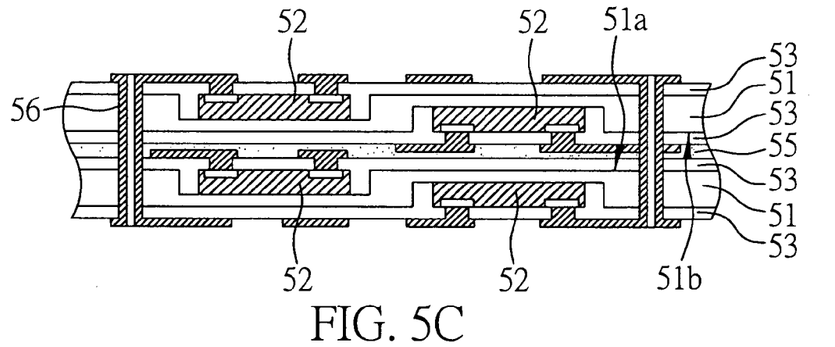

Referring to FIGS. 5A to 5C, cross-sectional views showing a stack structure with semiconductor chips embedded in a carrier according to another embodiment of the present invention are provided, wherein it is distinguished from the foregoing embodiment by having a cavity 41c of a carrier 41 that is non-through and is selectively formed on the first surface and the second surface of the carrier.

As shown in FIG. 5A, at least one non-through cavity 51c is formed on at least two carriers 51 respectively, and the directions of the cavities 51c are selectively formed on the first surface 51a and the second surfaces 51b of the carrier 51. The semiconductor chip 52 is placed in the cavity 51c of the carrier 51, wherein the active surfaces 52a having the electrode pads 52b of the semiconductor chip 52 are exposed to the external environment of the cavities 51c but secured therein, making the top and bottom surfaces of the carrier 51 having the active surfaces 52a of the semiconductor chips 52 formed thereon.

As shown in FIG. 5B, the dielectric layer 53 is respectively formed on the active surfaces 52a of the semiconductor chips 52 and the first and the second surfaces 51a, 51b of the supporting board, and the circuit layer 54 having the conductive structures 54a is formed on the dielectric layer 53, wherein the conductive structures 54a are formed in the dielectric layer 53 and electrically connected to the electrode pads 52b of the semiconductor chips 52, so that the carrier 51 has the circuit layers 54 on the first and the second surfaces 51a and 51b.

Figure 5D:
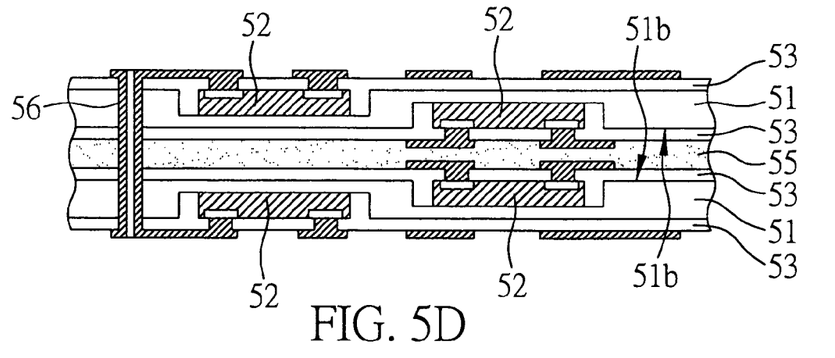

Referring to FIG. 5C and 5D, two carriers 51 having the semiconductor chips embedded therein are stacked with an linking layer 55 formed therebetween, making the first surface 51a of the carrier 51 stacked with the second surface 51b of another carrier 51 in a manner as stacking in the same direction (as shown in FIG. 5C); or having the second surface 51b of the carrier 51 stacked with the second surface 51b of another carrier 51 in a vertically opposite manner (as shown in FIG. 5D). Furthermore, at least a plated through hole 56 is penetrating through the dielectric layer 53, the circuit layer 54, the linking layer 55 and at least two carriers 51, so that the plated through hole 56 is electrically connected to the circuit layer 54 of each layer for electrically connecting the semiconductor chips 52 embedded therebetween in the carrier 51, so as to form a module structure.

Fifth Preferred Embodiment

Figure 6:
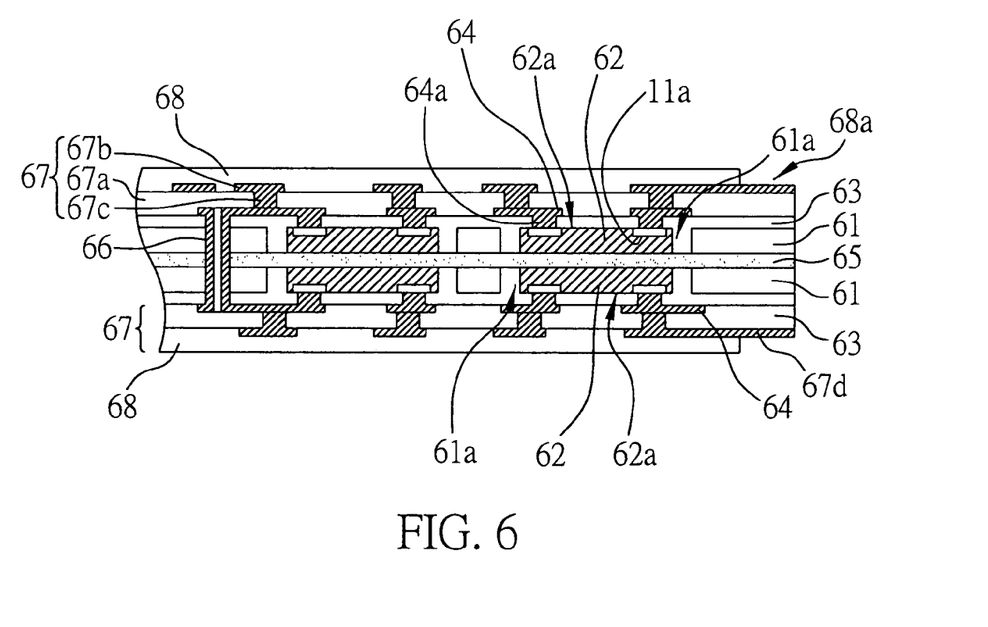
FIG. 6 is a cross-sectional view showing a stack structure with semiconductor chips embedded in a carrier according to a fifth embodiment of the present invention.

FIG. 6, a cross-sectional view showing a stack structure with semiconductor chips embedded in a carrier according to another embodiment of the present invention is provided, wherein the carrier 61 is formed with cavity 61a and the cavity 61a has the semiconductor chips embedded therein. Further, a dielectric layer 63 is formed on the active surface 62a of the semiconductor chip 62 and the surface of the carrier 61, a circuit layer 64 having a conductive structure 64a is formed in the dielectric layer 63. The conductive structure 64a is electrically connected to the electrode pad 62b of the semiconductor chip 62 with at least one linking layer 65 stacking to the carrier 61, and then at least one plated through hole 66 is electrically connected to the circuit layer 64. The structures as shown in the figures are used for explanation, however the invention should not be limited thereto, and could be any form of the foregoing stack structures.

At least one circuit build-up structure 67 is formed on the dielectric layer 63 and the circuit layer 64, wherein the circuit build-up structure 67 comprises the dielectric layer 67a, the circuit layer 67b stacked on the dielectric layer 67a and a plurality of conductive structures 67c formed in the dielectric layer 67a. The conductive structures 67c are electrically connected to the circuit layer 64. Further, the solder mask layer 68 is formed on the circuit build-up structure 67, and at least one opening 68a is formed on the surface of the solder mask layer 68 located at the edge of the stack structure, so as to expose the electrically connecting pads 67d employing for connecting external electric devices (not shown) of the circuit layer 67b formed on the surface of the circuit build-up structure 67.

The semiconductor chips 62 are embedded in the cavities 61a of the carriers 61, the dielectric layer 63 and the circuit layer 64 are formed on the active surfaces 62a of the semiconductor chips 62 and the surfaces of the carriers 61, and then two carriers 61 are stacked together with a plated through hole 66 penetrating therethrough to form a module structure further having the circuit build-up structure 67 formed therein, so that the semiconductor chips 62 may be embedded into the carrier 61 in order to reduce the overall size of the structure to achieve the purpose of being slim and small. A stack structure with semiconductor chips embedded in carriers is provided in the present invention, wherein the semiconductor chips are placed in the cavities of the carriers and then the carriers are stacked together. Furthermore, the dielectric layer, the circuit layer and the conductive structure are formed on the active surface of the semiconductor and the surface of the carrier, and the conductive structures are electrically connected to the electrode pads of the semiconductor chips so as to form a stacked module structure and avoid the thickness increment resulted from directly stacked-up in prior art and the defects of wire bonding package as being unable to reduce the size of the structure. Moreover, at least one plated through hole (PTH) is penetrated throughout the dielectric layers, the circuit layers, the linking layer and at least two carriers, so as to electrically connect the semiconductor chips of at least two carriers via the circuit layer and the plated through hole, so that the combinations can be changed flexibly to form the required storage capacity according to the requirement of use.

The invention has been described using exemplary preferred embodiments. However, it is to be understood that the scope of the invention is not limited to the disclosed embodiments. On the contrary, it is intended to cover various modifications and similar arrangement. The scope of the claims therefore should be accorded the broadest interpretation so as to encompass all such modifications and similar arrangements.

What is claimed is:

1. A stack structure with semiconductor chips embedded in carriers, comprising: two carriers having at least one cavity respectively formed thereto, wherein the carriers are stacked by a linking layer;
   at least two semiconductor chips placed in the cavities of the carriers, wherein the semiconductor chips are respectively formed with an active surface having a plurality of electrode pads and an inactive surface corresponding thereto;
   at least one dielectric layer formed on the active surface of the semiconductor chip and the surface of the carrier, wherein at least an opening is formed in the dielectric layer at a position corresponding to the top of the electrode pad; and
   at least one circuit layer formed on the surface of the dielectric layer and at least a conductive structure formed in the opening of the dielectric layer, wherein the circuit layer is electrically connected to the electrode pad of the semiconductor chip by the conductive structure.

2. The structure of claim 1, wherein the carrier is at least one of an insulating board and a circuit board having circuits.

3. The structure of claim 1, wherein the cavity of the carrier is a non-through cavity or a through cavity.

4. The structure of claim 3, wherein the carrier has a first surface and a second surface.

5. The structure of claim 4, wherein the cavity of the carrier is formed on at least one of the group of the first surface and the group of the second surface.

6. The structure of claim 5, wherein the carrier stacks the first surface thereof to the second surface of another carrier in the same direction.

7. The structure of claim 5, wherein the carrier stacks the second surface thereof to the second surface of another carrier in a vertically opposite direction.

8. The structure of claim 5, wherein the carriers stacks the first surface thereof to the first surface of another carrier in a vertically opposite direction.

9. The structure of claim 1, wherein the linking layer is an organic adhesive material.

10. The structure of claim 1, further comprising at least one plated through hole penetrating through the dielectric layer, the circuit layer, the linking layer and two carriers, so as to electrically connect the semiconductor chips.

11. The structure of claim 10, further comprising at least one circuit build-up structure formed on the surface of the dielectric layer and the circuit layer, wherein a plurality of conductive structures are formed in the circuit build-up structure for electrically connecting to the circuit layer and a plurality of connecting pads are formed on the surface of the circuit build-up structure.

12. The structure of claim 11, further comprising a solder mask layer formed on the circuit build-up structure with at least one opening formed on the surface of the solder mask layer located at the edge of the stack structure, so as to expose the electrically connecting pads of the circuit layer formed on the surface of the circuit build-up structure that are used to connect other electric devices.

13. The structure of claim 12, wherein the circuit build-up structure comprises a dielectric layer, a circuit layer stacked thereon and a plurality of conductive structures formed therein.

* * * * *